US008617427B2

(12) United States Patent
Jiang et al.

(10) Patent No.: US 8,617,427 B2
(45) Date of Patent: Dec. 31, 2013

(54) ELECTRICALLY CONDUCTIVE POLYMERIC COMPOSITIONS, CONTACTS, ASSEMBLIES AND METHODS

(75) Inventors: Hong Jiang, Irvine, CA (US); Aziz S. Shaikh, San Diego, CA (US)

(73) Assignee: Heraeus Precious Metals North America Conshohocken LLC, West Conshohocken, PA (US)

( * ) Notice: Subject to any disclaimer, the term of this patent is extended or adjusted under 35 U.S.C. 154(b) by 449 days.

(21) Appl. No.: 12/675,623

(22) PCT Filed: Oct. 22, 2009

(86) PCT No.: PCT/US2009/061659
§ 371 (c)(1),
(2), (4) Date: Jan. 24, 2011

(87) PCT Pub. No.: WO2010/048387
PCT Pub. Date: Apr. 29, 2010

(65) Prior Publication Data
US 2011/0186787 A1    Aug. 4, 2011

Related U.S. Application Data

(60) Provisional application No. 61/107,371, filed on Oct. 22, 2008.

(51) Int. Cl.
*H01B 1/22* (2006.01)
(52) U.S. Cl.
USPC ............ 252/514; 252/512; 524/439; 524/495
(58) Field of Classification Search
USPC .................... 252/512, 513, 514; 524/439, 495
See application file for complete search history.

(56) References Cited

U.S. PATENT DOCUMENTS

| | | | |
|---|---|---|---|
| 4,156,035 A | 5/1979 | Tsao et al. | |
| 4,999,136 A | 3/1991 | Su et al. | |
| 5,039,740 A | 8/1991 | Anderson et al. | |
| 5,514,729 A | 5/1996 | Diamant et al. | |
| 5,707,554 A | 1/1998 | Bennett et al. | |
| 6,071,437 A | 6/2000 | Oya | |
| 6,290,881 B1 | 9/2001 | Krohn | |
| 6,713,000 B2 | 3/2004 | Krohn | |
| 6,905,637 B2 | 6/2005 | Yeager et al. | |
| 7,157,507 B2 | 1/2007 | Krohn | |
| 7,323,499 B2 | 1/2008 | Krohn | |
| 7,422,707 B2 | 9/2008 | Zhuo | |
| 2002/0019506 A1 | 2/2002 | Beckley et al. | |
| 2004/0079928 A1* | 4/2004 | Geer et al. | 252/512 |
| 2005/0109990 A1 | 5/2005 | Yeager et al. | |
| 2006/0102228 A1 | 5/2006 | Sridharan et al. | |
| 2006/0289055 A1 | 12/2006 | Sridharan et al. | |
| 2008/0114089 A1 | 5/2008 | Krohn | |
| 2008/0178930 A1 | 7/2008 | Konno | |
| 2009/0215940 A1 | 8/2009 | Dershem | |

FOREIGN PATENT DOCUMENTS

EP    0 467 119 A1    1/1992

OTHER PUBLICATIONS

A. J. Lonvinger, "Development of Electrical Conduction in Silver-filled Epoxy Adhesives", J. Adhesion, 1979, vol. 10, pp. 1-15, Gordon and Breach Science Publishers Ltd., 1979, Scotland.

* cited by examiner

*Primary Examiner* — Mark Kopec
*Assistant Examiner* — Haidung Nguyen
(74) *Attorney, Agent, or Firm* — Blank Rome LLP

(57) ABSTRACT

Electrically conductive polymeric compositions adapted for use in forming electronic devices are disclosed. The compositions are thermally curable at temperatures less than about 250° C. Compositions are provided which may be solvent-free and so can be used in processing or manufacturing operations without solvent recovery concerns. The compositions utilize (i) fatty acid modified epoxy acrylate and/or methacrylate monomer(s) and/or oligomer(s), (ii) fatty acid modified polyester acrylate and/or methacrylate monomer(s) and/or oligomer(s), or combinations of (i) and (ii). Also described are electronic assemblies such as solar cells using the various compositions and related methods.

15 Claims, 2 Drawing Sheets

ELECTRICALLY CONDUCTIVE POLYMERIC COMPOSITIONS, CONTACTS, ASSEMBLIES AND METHODS

CROSS REFERENCES TO RELATED APPLICATIONS

This application claims priority upon U.S. provisional application Ser. No. 61/107,371 filed Oct. 22, 2008, herein incorporated by reference.

FIELD OF THE INVENTION

The present invention relates to electrically conductive polymeric compositions that can be cured at low temperatures. The compositions can be used in a wide range of electronic assemblies such as solar cells. The invention also relates to the resulting assemblies and related methods of use.

BACKGROUND OF THE INVENTION

Electrically conductive polymeric compositions are well known and have a wide variety of applications. These compositions can be used to form electrically conductive films and patterns in electronic devices for example. An example of such an application is the use of a paste in manufacturing photovoltaic cells. Silver electrodes having low contact resistance can be formed from these conductive compositions. However, silver paste used for making photovoltaic cells based on crystalline silicon, requires high temperatures for curing, such as firing temperatures greater than 700° C. This is problematic for certain devices, since many electronic devices should not be exposed to such high temperatures. For example, when forming solar cells having a Si:H base, processing temperatures must not exceed 250° C., so as to not degrade the heat sensitive material. Thus, many known electrically conductive compositions can not be used for such applications. The high electrical conductivity is another requirement in applications, such as solar cells to achieve high efficiency. Therefore, it would be desirable to provide highly electrically conductive compositions that can be thermally cured at relatively low temperatures, such as less than 250° C.

Most polymeric compositions used in forming electronic components include a solvent that must eventually be removed either after application of the composition and/or upon curing. Solvent removal operations raise various environmental concerns and typically increase overall expense associated with processing the composition and/or forming the electronic assembly. In addition, solvent removal operations generally increase manufacturing or processing times and increase production variables thus leading to increased defect rates and/or lower quality in the products. Thus, it would be particularly desirable to provide an electrically conductive composition that was solvent-free.

SUMMARY OF THE INVENTION

The difficulties and drawbacks associated with previous-type systems are overcome in the present invention.

In one aspect, the present invention provides an electrically conductive, thermally curable composition comprising (a) an effective amount of (i) fatty acid modified epoxy acrylate and/or methacrylate monomer(s) or oligomer(s), (ii) fatty acid modified polyester acrylate and/or methacrylate monomer(s) or oligomer(s), or (iii) combinations of (i) and (ii), and (b) an effective amount of electrically conductive particles.

In another aspect, the present invention provides a method of forming an electrically conductive layer or component on a substrate. The method comprises forming a composition comprising (a) an optional reactive diluent, (b) a selection from the group consisting of (i) fatty acid modified epoxy acrylate and/or methacrylate monomer(s) or oligomer(s), (ii) fatty acid modified polyester acrylate and/or methacrylate monomer(s) or oligomer(s), and (iii) combinations of (i) and (ii), (c) metallic particles, and (d) a free radical initiator. The method also comprises applying the composition on the substrate to a thickness of from about 1 to about 100 microns. And, the method comprises heating the applied composition to a temperature less than 250° C. to form the electrically conductive layer.

In yet another aspect, the present invention provides a substrate having a thin layer of an electrically conductive polymeric material. The material includes from about 70% to about 90% of metallic particles dispersed in a polymeric matrix formed from thermally curing a composition comprising (a) an optional reactive diluent, (b) a selection from the group consisting of (i) fatty acid modified epoxy acrylate and/or methacrylate monomer(s) or oligomer(s), (ii) fatty acid modified polyester acrylate and/or methacrylate monomer(s) or oligomer(s), and (iii) combinations of (i) and (ii), and (c) an effective amount of a free radical initiator.

In still another aspect, the present invention provides a photovoltaic device comprising a plurality of layers, and an electrically conductive member. The electrically conductive member is formed from a composition comprising (a) an effective amount of electrically conductive particles, and (b) an effective amount of a selection from the group consisting of (i) fatty acid modified epoxy acrylate and/or methacrylate monomer(s) or oligomer(s), (ii) fatty acid modified polyester acrylate and/or methacrylate monomer(s) or oligomer(s), and (iii) combinations of (i) and (ii).

In another aspect, the present invention provides a layered assembly comprising a substrate; a layer of transparent conducting oxide (TCO), such as indium tin oxide (ITO) on the substrate; and an electrically conductive member in electrical communication with the layer of the transparent conducting oxide. The electrically conductive member is formed from a composition comprising (a) an effective amount of electrically conductive particles, and (b) an effective amount of a selection from the group consisting of (i) fatty acid modified epoxy acrylate and/or methacrylate monomer(s) and/or oligomer(s), (ii) fatty acid modified polyester acrylate and/or methacrylate monomer(s) or oligomer(s), and (iii) combinations of (i) and (ii).

In still a further aspect, the present invention provides a layered assembly comprising a silicon substrate; a layer of aluminum on the silicon substrate; and an electrically conductive member in electrical communication with the layer of aluminum. The electrically conductive member is formed from a composition comprising (a) an effective amount of electrically conductive particles, and (b) an effective amount of a selection from the group consisting of (i) fatty acid modified epoxy acrylate and/or methacrylate monomer(s) and/or oligomer(s), (ii) fatty acid modified polyester acrylate and/or methacrylate monomer(s) or oligomer(s), and (iii) combinations of (i) and (ii).

As will be realized, the invention is capable of other and different embodiments and its several details are capable of modifications in various respects, all without departing from the invention. Accordingly, the description is to be regarded as illustrative and not restrictive.

DESCRIPTION OF THE PREFERRED EMBODIMENTS

Figure 1:
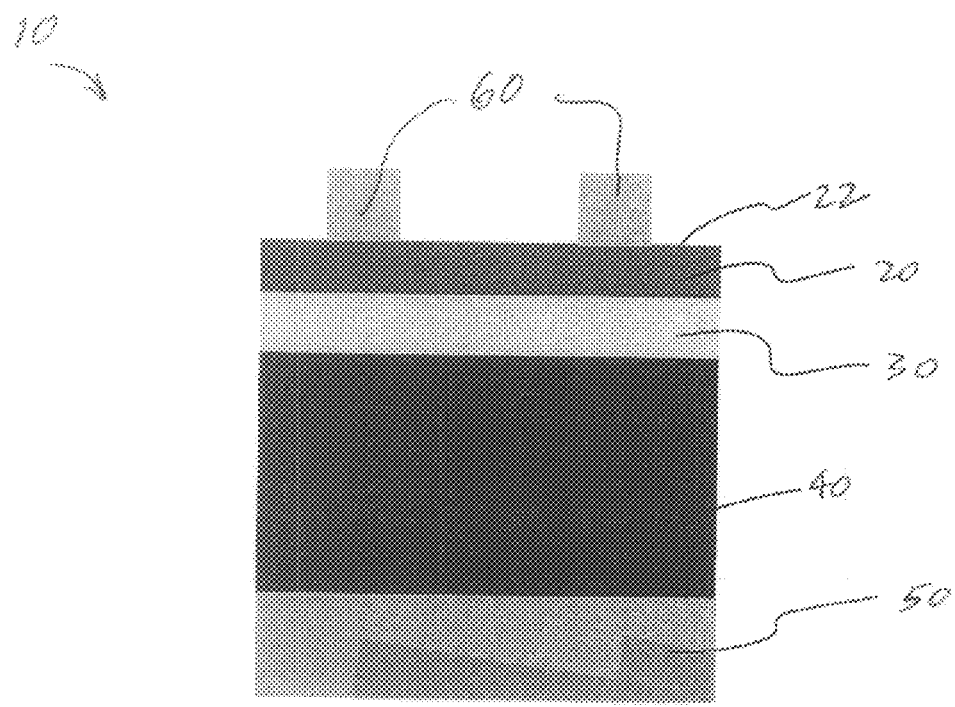
FIG. 1 is a schematic cross sectional view of a representative preferred embodiment layered assembly having contacts formed from the compositions described herein.

The present invention provides an electrically conductive, low temperature thermally curable polymeric composition that can be used in numerous applications, such as those where processing temperatures must not exceed 250° C. In certain versions of the invention, the compositions are solvent-free. The invention also provides methods of forming electrically conductive films, circuits, traces, contacts and the like using the inventive compositions. And, the invention includes devices, products and/or coated substrates formed using the inventive compositions and methods.

Generally, the compositions prior to curing, comprise one or more epoxy acrylate and/or methacrylate monomer(s) or oligomers, one or more optional reactive diluents, electrically conductive particles, and one or more free radical initiators. As explained in greater detail herein, in certain aspects of the invention, a particular class of epoxy acrylate or methacrylate monomer(s) or oligomers is used for the epoxy acrylate oligomer component. And, in further aspects of the invention, a particular combination of epoxy acrylate oligomers is used for the epoxy acrylate oligomer component.

The term "epoxy acrylate or methacrylate monomer/oligomer" as used herein refers to monomers or oligomers formed from an epoxy resin and one or more acrylates/methacrylates (or acrylic or methacrylic acid). Thus, the term "epoxy acrylate oligomer" includes a wide range of material classes such as, but not limited to, aromatic difunctional epoxy acrylates and methacrylates, novolac epoxy acrylates and methacrylates, acrylated oil epoxy acrylates and methacrylates, aliphatic epoxy acrylates and methacrylates, and specialty epoxy oligomers containing acrylates and/or methacrylates. The monomers and/or oligomers may include exclusively acrylates or exclusively methacrylates, or may include both acrylates and methacrylates. An example of an aromatic difunctional epoxy acrylate is bisphenol A diglycidyl ether based epoxy acrylates. Preferably, the epoxy acrylate and/or methacrylate oligomers used in the preferred embodiment compositions described herein do not have any free epoxy groups left. However, it will be appreciated that the epoxy acrylate and/or methacrylate oligomers used may include a proportion of unreacted epoxy groups. Preferably, the proportion of unreacted epoxy groups is less than 30% and more preferably less than 10%.

The term "oligomer" as used herein generally refers to a polymer or corresponding structure having a number average molecular weight of from about 250 to about 20,000, and preferably from about 500 to about 10,000.

The epoxy acrylates and/or methacrylates described herein typically have a functionality of 10 or less with 1 to 8 being preferred and 2 to 6 being most preferred.

The preferred embodiment compositions of the present invention comprise particular epoxy acrylate and/or methacrylate oligomers which include one or more fatty acids. Thus, these fatty acid-containing oligomers are referred to herein as "fatty acid modified epoxy acrylate or methacrylate oligomers." The fatty acid modified epoxy acrylate oligomers are typically formed by reacting an epoxy resin with a mixture of acrylates and/or methacrylates (or acrylic acid and/or methacrylic acid) and one or more fatty acids. The fatty acid group(s) substitute the acrylate and/or methacrylate group(s). Most preferably, the epoxy acrylate or methacrylate oligomers are fatty acid modified acrylate or methacrylate epoxy oligomers having a functionality of 2 to 6. The fatty acid modified epoxy acrylates and/or methacrylates can be in the form of monomers, selectively polymerized to form oligomers, or combinations of monomers and oligomers. In certain optional versions of the preferred embodiments, a combination of fatty acid modified epoxy diacrylate oligomers and epoxy triacrylate oligomers are used. This particular combination has been discovered to provide remarkably high levels of electrical conductivity. Both solvent-free and solvent-containing compositions exhibit high electrical conductivity using the particular fatty acid modified epoxy acrylates.

A wide range of fatty acids can be used in the preferred fatty acid modified epoxy acrylate oligomers. For example, the hydrocarbon chain length of the fatty acid group may vary from 10 to 30 carbons, and typically is in the range of from 12 to 18. The fatty acids can be either saturated or unsaturated. Moreover, it is also contemplated that dimer fatty acids can also be incorporated into the fatty acid modified epoxy acrylate or methacrylate oligomers.

Preferably, the fatty acid modified diacrylate epoxy oligomer is commercially available under the designation Genomer 2259 available from Rahn USA. Examples of other preferred commercially available fatty acid modified diacrylate epoxy oligomers include, but are not limited to Genomer 2255, also available from Rahn USA. Genomer 2255 and 2259 are modified bisphenol A epoxy acrylates. Genomer 2255 is modified to a lesser degree than 2259. Genomer 2259 is believed to be a lauric acid modified epoxy acrylate with an average functionality of 2. The epoxy diacrylate oligomer can be used in any amount that results in an increase in electrical conductivity, and hence can be used in an "effective concentration." An effective concentration for the fatty acid modified epoxy acrylate and/or methacrylate monomer(s) or oligomer(s) is typically, a concentration of from about 0.1% to about 30% (all percentages expressed herein are percentages by weight based upon the composition prior to curing, unless expressed otherwise).

Additional examples of preferred commercially available epoxy oligomers include, but are not limited to, CN113D70 and CN2101. These are both available from Sartomer Company. CN113D70 is a fatty acid modified trifunctional epoxy acrylate, and is believed to be a modified epoxy novolac acrylate with 30% SR9020, propoxylated glycerol triacrylate. CN113D70 has a glass transition temperature (Tg) of 51° C. CN2101 is a fatty acid modified epoxy acrylate. CN2101 has a glass transition temperature (Tg) of 63° C. CN2101 is supplied as a mixture of epoxy acrylate oligomer and acrylic esters.

The optional epoxy triacrylate oligomer is aliphatic and preferably CN133 available from Sartomer Company, Inc. CN133 is believed to be trimethylolpropanol and/or glycerol glycidyl ether based epoxy acrylate. CN133 has a glass transition temperature (Tg) of 60° C. It is used primarily to increase curing speed. The epoxy triacrylate oligomer, if used, is preferably used at a concentration of from about 0.1% to about 25%.

In addition to, or instead of, the fatty acid modified epoxy acrylates and/or methacrylates (which as noted can be exclusively or a mixture of monomer(s) and/or oligomer(s)), the present invention includes the incorporation of fatty acid modified polyester acrylates and/or methacrylates. When used in combination, the fatty acid modified polyester acrylates and/or methacrylates can be used in nearly any proportion to the fatty acid modified epoxy acrylates and/or methacrylates. The fatty acid modified polyester acrylates or methacrylates are formed by reacting one or more polyols with a mixture of polycarboxylic acids, acrylic and/or methacrylic acid, and fatty acids. The fatty acids are as previously described. Acrylic and/or methacrylic acid is known to those skilled in the art. And, polycarboxylic acids are generally compounds containing two or more carboxylic acid groups. An example of a polycarboxylic acid is dicarboxylic acid having two —COON groups. Generally, the functionality of the polycarboxyl component is from 2 to 10, and preferably 2 to 6. The polyol component can be selected from nearly any polyol known in the art. An effective concentration for the fatty acid modified polyester acrylate and/or methacrylate monomer(s) or oligomer(s) is typically, a concentration of from about 0.1% to about 30%. As noted, the inventive compositions may use a combination of fatty acid modified epoxy acrylate and/or methacrylate monomer(s) or oligomer(s), and fatty acid modified polyester acrylate and/or methacrylate monomer(s) or oligomer(s). When using a combination of these classes of fatty acid modified components, their total concentration is from about 0.1% to about 30%.

The fatty acid modified polyester acrylate can be obtained commercially such as from Rahn USA under the designation Genomer 3611. Genomer 3611 is believed to be a hexafunctional polyester acrylate with stearate end groups.

The present invention composition may also optionally comprise an effective amount of a reactive diluent. An example of such a reactive diluent when using the noted combination of a diacrylate epoxy oligomer and a triacrylate epoxy oligomer, is hexane diol diacrylate. Hexane diol diacrylate is available from Rahn USA Corp under the designation Miramar M200. Other reactive diluents may be used. An example of an effective amount is a concentration of from about 1% to about 10%, more preferably from about 2% to about 8%, with a concentration of about 4% to about 7% being most preferred. It will be understood however, that in certain applications, it may not be necessary to use a reactive diluent if for example, the viscosity of the resulting composition, prior to curing, is suitable and compatible for the subsequent processing and application operations.

The inventive compositions also comprise one or more free radical initiators, such as for example 2,5-dimethyl-2,5-di(t-butylperoxy)-3-hexyne which is available from Sigma Aldrich. Other free radical initiators, such as dicumyl peroxide, dibenzoyl peroxide, 1,1-di(t-amylperoxy)cyclohexane, similar agents, and combinations thereof may be used. It will be appreciated that in no way is the present invention or its preferred embodiments limited to these particular free radical initiators. It is contemplated that nearly any organic peroxide selected to be compatible with the components of the composition and the curing conditions can be used. Moreover, it is also contemplated that for certain applications it may be possible to use other types of free radical initiators such as halogen molecules and/or azo compounds. The selected free radical initiator(s) is used at a concentration generally effective to initiate polymerization of the system. Such concentrations are typically from about 0.01% to about 2%, with 0.3% being preferred.

The composition also comprises electrically conductive particles, and preferably metallic particles. A wide array of metals may be used, however in view of its excellent properties, silver is preferred. The metal particles can be in a range of different forms, such as flakes or particles. For many applications, flakes are preferred. The concentration of the metal flakes in the present invention composition may vary depending upon end use requirements of the composition, but is typically an effective amount which is from about 70% to about 90%, and most preferably about 80%.

As noted, a wide array of electrically conductive metals can be used in the present invention compositions. The conductive material is preferably selected from among electrically conductive particulate materials, such as silver, gold, palladium, nickel, and combinations thereof, having sizes in the range of from about 0.1 micron to about 20 microns. In a preferred embodiment, conductive particulates having elongated shapes such as flakes with lengths of up to approximately 20 microns and thicknesses of approximately 2 microns or less are used. The elongation of these particulates is represented by their aspect ratio, which is the ratio of the dimension of the particle along the longest axis to the dimension of the particle along a lateral or orthogonal axis. The conductivity of polymeric compositions in accordance with the present invention generally increases with the aspect ratio of the conductive particulates. Illustrative of the conductive metallic materials employed in the present invention are, for example, silver flakes which are available, from Ferro Corporation or Degussa Metz Metalurgical Corporation.

A wide array of other additives, components, and/or agents can be added or otherwise incorporated in the inventive compositions. For example, various wetting agents, defoamers and viscosity adjusting additives can be added. For example, BYK® 321, available commercially from BYK USA of Wallingford, Conn., can be used as a wetting agent. BYK® 321 is believed to be a polyether modified methylalkylpolysiloxane copolymer.

The present invention composition is preferably formed by combining the free radical initiator with the reactive diluent followed by the addition of the epoxy acrylate oligomers, which as noted is preferably the epoxy diacrylate oligomer and the epoxy triacrylate oligomer. The intermediate mixture is thoroughly mixed until a homogenous resin mixture is obtained. The electrically conductive metallic particulate which is preferably silver flakes, is then added followed by further mixing and optional milling.

Coated substrates, layered arrays, or devices for example using the present invention composition can be prepared by applying the composition in a desired region and to a desired thickness, and then curing the composition. Application of the composition can be preferred in numerous fashions, however screen printing is preferred. As will be appreciated by those skilled in the art, a wide array of patterns can be applied to form various contacts, traces, circuits and/or other electrically conductive regions.

Film or coating thicknesses may vary, but from about 1 to about 100 microns is typical, from about 10 to about 70 microns is preferred, with from about 15 to about 50 microns being most preferred for many applications.

As noted, the preferred embodiment compositions are thermally curable at relatively low temperatures, such as less than 250° C. Typical curing parameters utilize temperatures of about 140° C. to 200° C. for times of from about 5 seconds to about 20 minutes, with about 10 minutes being preferred. It is contemplated that curing times as long as 60 minutes or longer could be utilized. Curing and heating are preferably performed in air. However, it is contemplated that for many applications, curing may be performed in inert gas atmospheres.

It is also contemplated that the present invention compositions can be cured by exposure to UV radiation, upon incorporation of an effective amount of a UV cure agent instead of the previously noted initiator.

In certain applications, the present invention and the preferred embodiment compositions can be provided and used in a solvent-free state. As previously noted, solvents, and particularly hydrocarbon-based solvents, can be undesirable due to associated solvent removal and recovery equipment and operations. Thus, it is generally preferred that the compositions are solvent-free. However, the present invention includes compositions containing solvent, such as ethylene glycol ethers and acetates, or which are mixed or otherwise combined with solvents.

The present invention also provides electrical assemblies such as photovoltaic devices such as solar cells utilizing the inventive compositions described herein. The term "photovoltaic device" as used herein refers to a device that converts light into electricity, and preferably, directly into direct current (dc) electricity. The compositions can be used to form electrically conductive contacts, busbars, pads, attachment tabs, and similar components on or in conjunction with the layered assemblies, and in particular with solar cells.

Solar cells are generally made of semiconductor materials, such as silicon (Si), which convert sunlight into useful electrical energy. Solar cells are, in general, made of thin wafers of Si in which the required PN junction is formed by diffusing phosphorus (P) from a suitable phosphorus source into a P-type Si wafer. The side of silicon wafer on which sunlight is incident is in general coated with an anti-reflective coating (ARC) to prevent reflective loss of incoming sunlight, and thus to increase the efficiency of the solar cell. A two dimensional electrode grid pattern known as a front contact makes a connection to the N-side of silicon, and a coating of aluminum (Al) on the other side (back contact) makes connection to the P-side of the silicon. These contacts are the electrical outlets from the PN junction to the outside load.

FIG. 1 illustrates a preferred embodiment assembly 10 in accordance with the present invention. The assembly 10 comprises a layer of a semiconductor material 40 such as copper indium gallium (di)selenide (CIGS) disposed between an upper layer 30 such as an optoelectronic layer which may for example be a layer of a cadmium sulfide (CdS) photoresistor, and a lower layer 50 which may be a back contact formed from a metal such as molybdenum. Disposed on the upper layer 30 is a layer 20 of a transparent conducting oxide (TCO) which may for example be formed from indium tin oxide (ITO) or other suitable materials known in the art. The top surface of the TCO layer defines an upper face 22. One or more electrical contacts 60 or other conductive components are disposed on the layered assembly. The contacts 60 are formed from the inventive compositions described herein.

Figure 2:
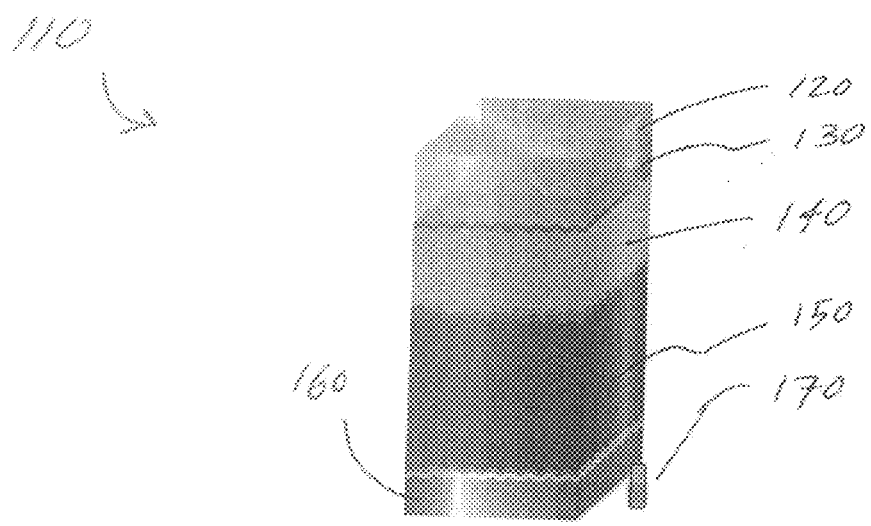
FIG. 2 is a schematic cross sectional view of another representative preferred embodiment layered assembly having an attachment tab formed from the compositions described herein.

FIG. 2 illustrates another preferred embodiment assembly 110 in accordance with the present invention. The assembly 110 comprises a transparent or substantially so top substrate 120, which may for example be formed from glass. One or more layers of a transparent conductor 130 are preferably positioned between the top substrate 120 and an amorphous silicon layer 140. Disposed between the amorphous silicon layer 140 and a back contact layer 160 is a layer of microcrystalline silicon 150. One or more electrical components such as an attachment tab 170 can be incorporated into the assembly 110 such as the tab 170 that is in electrical communication with the back contact 160. The attachment tab 170 is formed from the inventive compositions described herein.

Figure 3:
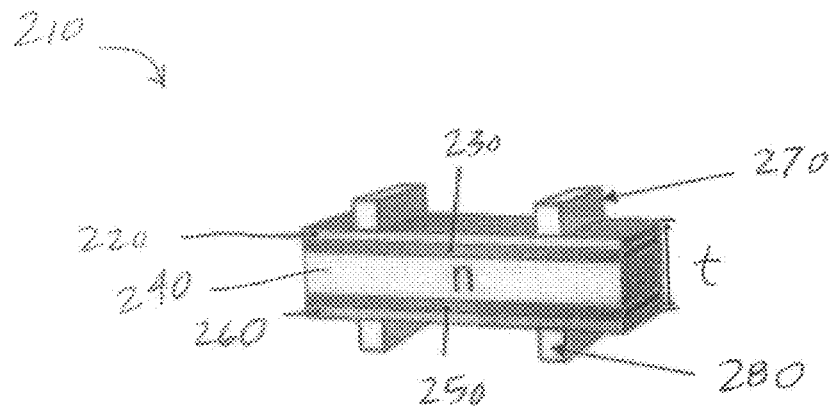
FIG. 3 is a schematic perspective view of a representative preferred solar cell utilizing upper and lower busbars formed from the compositions described herein.

FIG. 3 illustrates yet another preferred embodiment assembly 210 in accordance with the present invention. The assembly 210 is generally in the form of a solar cell and comprises an intermediate layer 240 which is for example an n-type semiconductor material. Disposed on one face of the intermediate layer 240 is a p-type/i-type material layer 230 which can for example be a thin amorphous silicon layer. Disposed on an opposite face of the intermediate layer 240 is an i-type/n-type material layer 250 which can for example be a thin amorphous silicon layer. Disposed on the layer 230 is a front side electrode layer 220. And, disposed on the layer 250 is a rear side electrode layer 260. The assembly 210 further comprises one or more electrically conductive components such as busbars 270 disposed on the front side electrode 220. The assembly 210 can further comprise one or more electrically conductive components such as busbars 280 disposed on the rear side electrode 260. The various electrically conductive components, e.g. the busbars 270 and 280, are formed from the compositions described herein. The thickness of the assembly 210 is relatively thin. For example, the total thickness of the collection of layers 220, 230, 240, 250, and 260 is from about 100 µm to about 400 µm, and typically about 200 µm.

Figure 4:
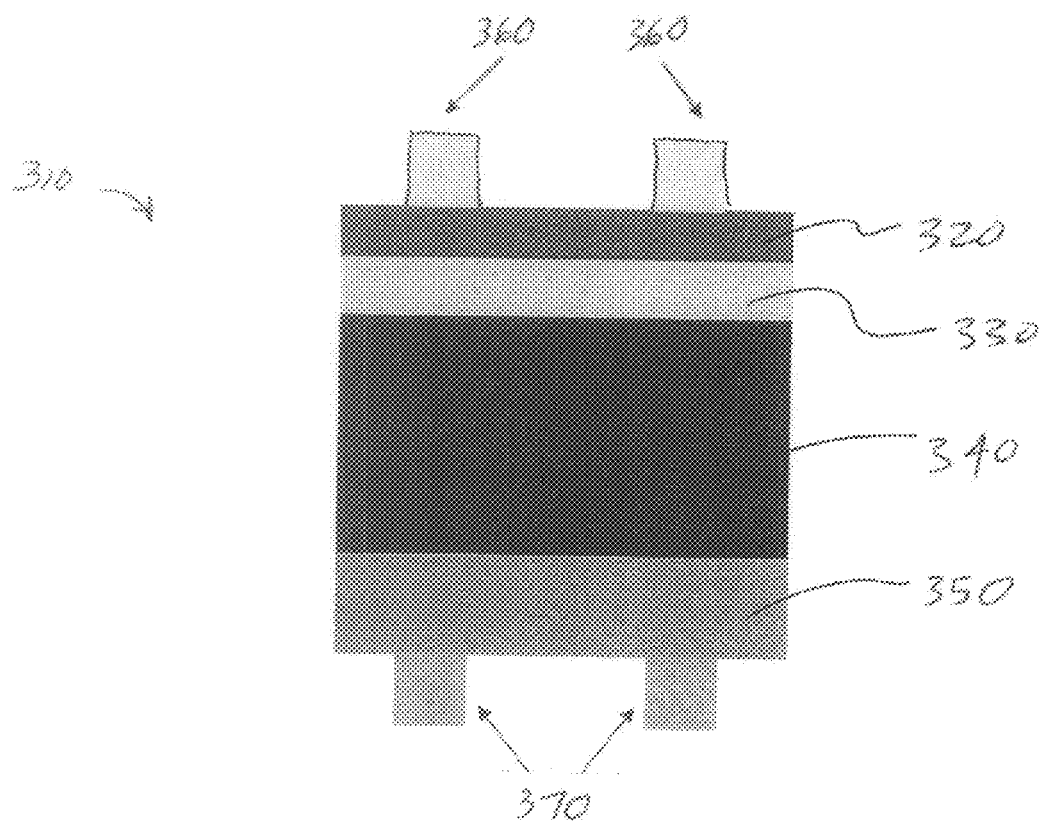
FIG. 4 is a schematic cross sectional view of another representative preferred embodiment layered assembly having a lower busbar formed from the compositions described herein.

FIG. 4 illustrates another preferred embodiment assembly 310 in accordance with the present invention. The assembly 310 may for example be in the form of a polycrystalline and a monocrystalline silicon cell comprising an intermediate layer 340 of a p-type silicon material disposed alongside a layer 330 of an n-emitter material. A top layer 320 of a silicon nitride material and a bottom layer 350 constituting a back contact layer formed of aluminum for example are included in the cell 310. One or more contacts 360 are provided along the top or front face of layer 320. And one or more electrically conductive busbars 370 are provided along the bottom or rear contact layer 350. The busbars 370 are formed from the inventive compositions. It is also contemplated that the contacts 360 could also be formed from the inventive compositions.

The present invention compositions find particular use in conjunction with a photovoltaic device comprising amorphous or crystalline silicone; and/or a photovoltaic device comprising a CIGS material. The present invention compositions can also be used as a backside conductor on top of an aluminum conductor layer in a crystalline silicon solar cell. In addition, the present invention compositions can be used to form contacts having low electrical resistance on (i) transparent conductors such as ITO on substrates and (ii) aluminum on silicon substrates.

The present invention also provides a strategy for achieving a particular or desired electrical conductivity characteristic by selectively curing the inventive compositions described herein. That is, by following one or more designated curing profiles, electrical components such as contacts, busbars, tabs and the like, can be formed having particular electrical conductivity levels. After preparation of a preferred embodiment composition, the composition is cured at a desired temperature and for a desired time period to achieve a desired electrical resistivity characteristic of the resulting cured composition. Generally, by heating at higher temperatures, the extent of curing increases and the resistivity of the resulting cured compositions decreases. Although not wishing to be bound to any particular theory, it is contemplated that increasing the time period of curing will also produce cured compositions having reduced resistivity values. However, as explained in greater detail herein, it is believed that as curing temperature (and extent of curing) is increased, the resistivity of the resulting cured composition will reach some minimum value.

Using the inventive compositions, various layered assemblies can be formed with electrically conductive members that exhibit remarkably low contact resistivities. For example, layered assemblies having electrical contacts formed from the preferred embodiment compositions can be prepared in which the electrically conductive contact, after curing, exhibits a resistivity of less than 20 ohm·cm², preferably less than 5 ohm·cm², and most preferably less than 2 ohm·cm².

Additional details and description concerning compositions, electrical assemblies such as solar cells, contacts, and related components and methods are provided in U.S. patent application Ser. No. 11/145,538 filed Jun. 3, 2005, published as US 2006/0289055; and U.S. patent application Ser. No. 10/988,208 filed Nov. 11, 2004, published as US 2006/0102228.

EXAMPLES

A series of investigations were conducted to further assess the nature of the present invention. Compositions as described in Examples 1-4 were prepared as described herein, and are set forth below in Table 1. The composition of Example 1 is a control, while the compositions of claims 2-4 are representative preferred embodiment compositions. These four compositions (in weight %) are as follows:

TABLE 1

Control and Preferred Embodiment Compositions

| Components | Example 1 | Example 2 | Example 3 | Example 4 |
|---|---|---|---|---|
| Hexane diol diacrylate | 4 | 4 | 4 | 6.7 |
| Genomer 2259 (Rahn USA Corp) | 0 | 7.85 | 15.7 | 3 |
| CN133 (Sartomer Company, Inc.) | 15.7 | 7.85 | 0 | 10 |
| 2,5-dimethyl-2,5-di(t-butylperoxy)-3-hexyne | 0.3 | 0.3 | 0.3 | 0.3 |
| Silver flake 9Al (Ferro Corp.) | 80 | 80 | 80 | 80 |

Hexane diol diacrylate is a reactive diluent from Rahn AG under the trade name Miramer M200.
Genomer 2259 is from Rahn AG and is a fatty acid modified epoxy acrylate oligomer with an acrylate functionality of two.
CN133 is from Sartomer Co., Inc. and is an epoxy acrylate oligomer with three acrylate functionality.
2,5-dimethyl-2,5-di(t-butylperoxy)-3-hexyne is available from Sigma Aldrich and is a free radical initiator.
Silver flake 9Al is from Ferro Corporation.

The peroxide was first mixed in with hexane diol diacrylate, followed by the addition of Genomer 2259 and CN133. The precursor composition was mixed thoroughly until a homogeneous resin mixture was obtained. Ag was added to the resin mixture, followed by mixing and milling.

Sample preparation for resistivity measurement was as follows: The paste was screen printed onto a glass substrate with a film thickness of 15-30 microns, followed by curing at 200° C. in air for 10 minutes. Electrical resistivity of Compositions 1, 2, 3, and 4 is as follows in Table 2:

TABLE 2

Electrical Resistivities

| | Example 1 | Example 2 | Example 3 | Example 4 |
|---|---|---|---|---|
| Resistivity (mΩ/sq/mil) | 18.1 | 8.1 | 8.0 | 6.5 |

Examples 1, 2 and 3 varied the weight percent CN133 and Genomer 2259, while keeping the remaining proportions of the composition. With no Genomer 2259 and only CN133, as in the case of Example 1, the resistivity is 18.1. The resistivity drops to less than half after replacing half the CN133 with Genomer 2259, as in the case of Example 2. Complete replacing of CN133 with Genomer 2259 still shows similar low resistivity as in the case of Example 3.

Compared to Example 2, Example 4 still has the same components, but with a lower Genomer 2259 to CN133 ratio. The similar low resistivity is again observed. The resistivity results from Examples 1 through 4 indicate that fatty acid modified acrylates, such as Genomer 2259, significantly promote electrical conductivity.

Another series of investigations were conducted to still further access the nature of the present invention. Compositions as described in Examples 5-6 were prepared in accordance with the present invention, and are as set forth below in Table 3. These compositions (in weight %) are as follows:

TABLE 3

Preferred Embodiment Compositions

| Components | Example 5 | Example 6 |
|---|---|---|
| Hexane diol diacrylate | 6.7 | 6.7 |
| Genomer 2263 | 3 | 0 |
| Genomer 2259 | 0 | 3 |
| CN133 | 10 | 10 |
| Benzoyl peroxide | 0.3 | 0.3 |
| Silver flake 9Al | 80 | 80 |
| Resistivity (mΩ/sq/mil) | 24.53 | 6.9 |

The Examples 5 and 6 show improved electrical conductivity as the fatty acid modification level increases. Genomer 2259 is fatty acid modified, whereas in contrast, Genomer 2263 is not fatty acid modified. Genomer 2263 is a bisphenol A diglycidyl ether based epoxy diacrylate.

Compositions as described in Examples 7 and 8 were also prepared in accordance with the invention and are as set forth below in Table 4.

TABLE 4

Preferred Embodiment Compositions

| Components | Example 7 | Example 8 |
|---|---|---|
| Hexane diol diacrylate | 6.8 | 6.8 |
| CN113D70 | 3 | 0 |
| CN2101 | 0 | 3 |
| CN133 | 10 | 10 |
| Dicumyl peroxide | 0.2 | 0.2 |
| Silver flake 9Al | 80 | 80 |
| Resistivity (mΩ/sq/mil) | 6.8 | 7.9 |

These compositions utilized a different fatty acid modified epoxy acrylate than those available under the Genomer designation. The fatty acid modified epoxy acrylates used in the compositions of Examples 7 and 8 are CN113D70 and CN2101.

The fatty acid modified epoxy acrylates CN113D70 and CN2101 also exhibited improved electrical conductivity.

Compositions as described in Examples 9-13 were prepared in accordance with the invention and are set forth below in Table 5.

TABLE 5

Preferred Embodiment Compositions

| Components | Example 9 | Example 10 | Example 11 | Example 12 | Example 13 |
|---|---|---|---|---|---|
| Hexane diol diacrylate | 5 | 3 | 6.2 | 0 | 6.6 |
| Pentaerythritol triacrylate | 0 | 1 | 0 | 0 | 0 |
| N,N'-M-phenylenedimaleimide | 0 | 0 | 0.5 | 0 | 0 |
| Ethoxylated hexane diol diacrylate | 0 | 0 | 0 | 6.8 | 0 |
| Genomer 2259 | 2.25 | 7.85 | 3 | 3 | 3 |
| CN133 | 7.5 | 7.85 | 10 | 10 | 9.8 |
| Ethylene glycol monobutyl ether | 5 | 0 | 0 | 0 | 0 |
| Wetting agent (BYK 321) | 0 | 0 | 0 | 0 | 0.3 |
| Dicumyl peroxide | 0.25 | 0 | 0 | 0.2 | 0.3 |
| 2,5-dimethyl-2,5-di(t-butylperoxy)-3-hexyne | 0 | 0.3 | 0 | 0 | 0 |
| Luperox 531M80 | 0 | 0 | 0.3 | 0 | 0 |
| Silver flake 9Al | 80 | 80 | 80 | 80 | 80 |
| Resistivity (mΩ/sq/mil) | 7.11 | 6.13 | 6.16 | 7.05 | 8.1 |

These compositions demonstrate that other components such as solvents (Example 9), monomers (Examples 10, 11 and 12), wetting agents, adhesion promoters (Example 1: 3) can also be added to the above mentioned systems without any negative impact on electrical conductivity. Luperox 531 M80 is a polymerization initiator available from Arkema Canada, Inc. of Oakville, Ontario.

Two of the compositions were deposited on substrates and formed into electrical contacts. Corresponding contact resistivity was measured, as shown below in Table 6. Contact resistivity was measured by the Transmission Line (TLM) method. Specifically the composition of Example 12 was deposited and formed into a contact on an aluminum surface. And, the composition of Example 9 was deposited and formed into a contact on an indium-tin-oxide (ITO) surface.

TABLE 6

Contact Resistivity

| Example 12 on Al ($\Omega \cdot cm^2$) | Example 9 on ITO ($\Omega \cdot cm^2$) |
|---|---|
| 0.1 | 0.05 |

Compositions as described in Examples 14 and 15 were prepared in accordance with the invention and are set forth below in Table 7:

TABLE 7

Preferred Embodiment Compositions

| Components | Example 14 | Example 15 |
|---|---|---|
| Hexane diol diacrylate | 6.8 | 6.8 |
| Genomer 2259 | 3 | 3 |
| CN133 | 10 | 10 |
| Dicumyl peroxide | 0.2 | 0.2 |
| Silver flake 80 | 80 | 0 |
| Silver flake 1 | 0 | 80 |
| Resistivity (mΩ/sq/mil) | 6.3 | 6.9 |

Silver flake 80 and silver flake 1 are from Ferro Corp.

These examples illustrate that the high electrically conductivity can be maintained with other silver flakes besides 9Al (Example 14 and 15).

Another key feature of this invention is that compositions can be made solvent-free and still provide high electrical conductivity, as in the case of Examples 1 through 4.

The present invention allows for curing at temperatures less than 250° C., which is beneficial for applications involving heat sensitive substrates. The excellent electrical conductivity is highly desirable in applications, such as thin film solar cells, to achieve high efficiency.

In yet another series of investigations, the impact of curing temperature upon electrical resistivity of the resulting cured composition was analyzed. In this review, several samples according to the composition of Example 3 were subjected to three different curing profiles, and then after curing, the resistivity of each sample was measured. The results are set forth below in Table 8:

TABLE 8

Effect of Cure Temperature on Resistivity

| Curing profile | Example 3 Resistivity (mΩ/sq/mil) |
|---|---|
| 10 min @ 160° C. | 9.79 |
| 10 min @ 180° C. | 8.92 |
| 10 min @ 200° C. | 8.0 |

These results indicate that compositions having relatively low electrical resistivity can be obtained by curing the preferred embodiment compositions at low temperatures, and less than 250° C. Although not wishing to be bound to any particular theory, it is believed that the resistivity of the compositions is generally a function of the extent of curing of the composition. Thus, although the use of higher curing temperatures may lead to lower resistivities, it will be appreciated that the lower resistivities are a result of the greater extent of cure that occurs from using higher curing temperatures. Moreover, it will be appreciated that as increasingly higher cure temperatures are used, the resistivity of the cured compositions will ultimately approach some minimum resistivity value. The results presented in Table 8 reveal that the inventive composition can be cured at relatively low temperatures, i.e. less than 250° C., and still provide consistent low resistivity characteristics.

In yet another series of investigations, compositions were prepared and cured to form electrically conductive materials having relatively low resistivities. In Example 16, a composition was formed using exclusively a fatty acid modified polyester acrylate, In Example 17, a composition was formed using a combination of a fatty acid modified polyester acrylate and a fatty acid modified epoxy acrylate. The compositions and their resulting resistivity after curing are set forth below in Table 9.

TABLE 9

Preferred Embodiment Compositions

| Components | Example 16 | Example 17 |
|---|---|---|
| Miramer M200 | 4.5 | 3.8 |
| Genomer 3611 | 4.3 | 3 |
| Genomer 2259 | 0 | 3 |
| CN133 | 10 | 9 |
| Dicumyl peroxide | 0.2 | 0.2 |
| Silver Flake 9Al | 80 | 80 |
| Resistivity (mΩ/sq/mil) | 7.4 | 7.9 |

The fact that the present invention also provides compositions that are highly electrically conductive with no solvent provides an opportunity for a more environmental friendly manufacturing process. Without the variable of solvent evaporation, the present invention allows for producing higher quality products. The invention may also reduce cycle time by eliminate the need for solvent evaporation. However, it will be understood that the present invention includes compositions containing solvent.

Additional aspects and details of known electrically conductive polymeric compositions which may be applicable to the present invention are provided in U.S. Pat. Nos. 4,999,136; 5,514,729; 6,071,437; 6,713,000; 7,157,507; and 7,323,499; and Patent Publications 2008/0114089; and 2008/0178930.

Many other benefits will no doubt become apparent from future application and development of this technology.

All patents, published applications, and articles noted herein are hereby incorporated by reference in their entirety.

As described hereinabove, the present invention solves many problems associated with previous type devices. However, it will be appreciated that various changes in the details, materials and formulations, which have been herein described and illustrated in order to explain the nature of the invention, may be made by those skilled in the art without departing from the principle and scope of the invention, as expressed in the appended claims.

What is claimed is:

1. An electrically conductive, thermally curable composition comprising:
    from about 70% to about 90% by weight of electrically conductive silver particles; and
    from about 0.1% to about 30% by weight of a selection from the group consisting of (i) fatty acid modified epoxy acrylate and/or methacrylate monomer(s) or oligomer(s), (ii) fatty acid modified polyester acrylate and/or methacrylate monomer(s) or oligomer(s), and (iii) combinations of (i) and (ii);
    wherein the composition is solvent-free and in the form of a paste that can be screen printed onto a substrate and thereafter cured at a temperature of less than 250° C. to form an electrically conductive contact, trace, circuit and/or other electrically conductive region.

2. The composition of claim 1 further comprising:
    an effective amount of a reactive diluent.

3. The composition of claim 1 further comprising:
    an effective amount of a free radical initiator.

4. The composition of claim 1 wherein the composition includes from about 0.1% to about 30% by weight of fatty acid modified epoxy acrylate and/or methacrylate monomer(s) or oligomer(s).

5. The composition of claim 1 wherein the composition includes from about 0.1% to about 30% by weight of fatty acid modified polyester acrylate and/or methacrylate monomer(s) or oligomer(s).

6. The composition of claim 1 wherein the composition includes from about 0.1% to about 30% by weight of a combination of (i) fatty acid modified epoxy acrylate and/or methacrylate monomer(s) or oligomer(s), and (ii) fatty acid modified polyester acrylate and/or methacrylate monomer(s) or oligomer(s).

7. The composition of claim 1 further comprising:
    an epoxy triacrylate oligomer.

8. The composition of claim 7 wherein the epoxy triacrylate oligomer is aliphatic.

9. The composition of claim 7 wherein the epoxy triacrylate oligomer is used at a concentration of from about 0.1% to about 25%.

10. The composition of claim 2 wherein the reactive diluent is hexane diol diacrylate.

11. The composition of claim 10 wherein the hexane diol diacrylate is used at a concentration of from about 1% to about 10%.

12. The composition of claim 10 wherein the hexane diol diacrylate is used at a concentration of from about 4% to about 7%.

13. The composition of claim 3 wherein the free radical initiator is selected from the group consisting of (i) 2,5-dimethyl-2,5-di(t-butylperoxy)-3-hexyne, (ii) dicumyl peroxide, and combinations thereof.

14. The composition of claim 3 wherein the free radical initiator is at a concentration of from about 0.01% to about 2%.

15. The composition of claim 3 wherein the free radical initiator is at a concentration of about 0.3%.

* * * * *